United States Patent [19]
Tompsett

[11] 4,085,456
[45] Apr. 18, 1978

[54] CHARGE TRANSFER IMAGING DEVICES

[75] Inventor: Michael Francis Tompsett, Summit, N.J.

[73] Assignee: Bell Telephone Laboratories, Incorporated, Murray Hill, N.J.

[21] Appl. No.: 285,054

[22] Filed: Aug. 30, 1972

Related U.S. Application Data

[63] Continuation-in-part of Ser. No. 124,735, Mar. 16, 1971, abandoned.

[51] Int. Cl.² .................. G11C 11/32; G11C 13/04; G11C 19/28
[52] U.S. Cl. .................. 365/114; 307/221 D; 357/24; 365/183
[58] Field of Search ............ 317/235 G; 307/221 D, 307/221 C; 340/173 LS; 357/24

[56] References Cited

U.S. PATENT DOCUMENTS

| | | | |
|---|---|---|---|
| 3,390,273 | 6/1968 | Weckler | 317/235 |
| 3,621,283 | 11/1971 | Teer | 317/235 |
| 3,643,106 | 2/1972 | Berwin et al. | 317/235 |
| 3,654,499 | 4/1972 | Smith | 317/235 |
| 3,678,347 | 7/1972 | Tulp et al. | 317/235 |
| 3,683,193 | 8/1972 | Weimer | 317/235 |

*Primary Examiner*—Stuart N. Hecker
*Attorney, Agent, or Firm*—Lester H. Birnbaum

[57] ABSTRACT

Line imaging and area imaging devices are described which employ the concept of storage and transfer of charge carriers in a semiconductor medium by the application of appropriate potentials to electrodes disposed above the medium. The devices are characterized by two arrays of electrodes, one functioning as an optical sensing array and the other as a storage and readout array. Charge carriers are collected in the medium under the metal electrodes of the sensing array in proportion to incident light. This information is rapidly transferred to the storage and readout array by sequentially biasing series of electrodes of the two arrays. The information may then be read out of the array without smearing while the sensing array continues to integrate. The structure includes means for preventing cross-coupling and maintaining transfer efficiency for small area electrodes.

19 Claims, 7 Drawing Figures

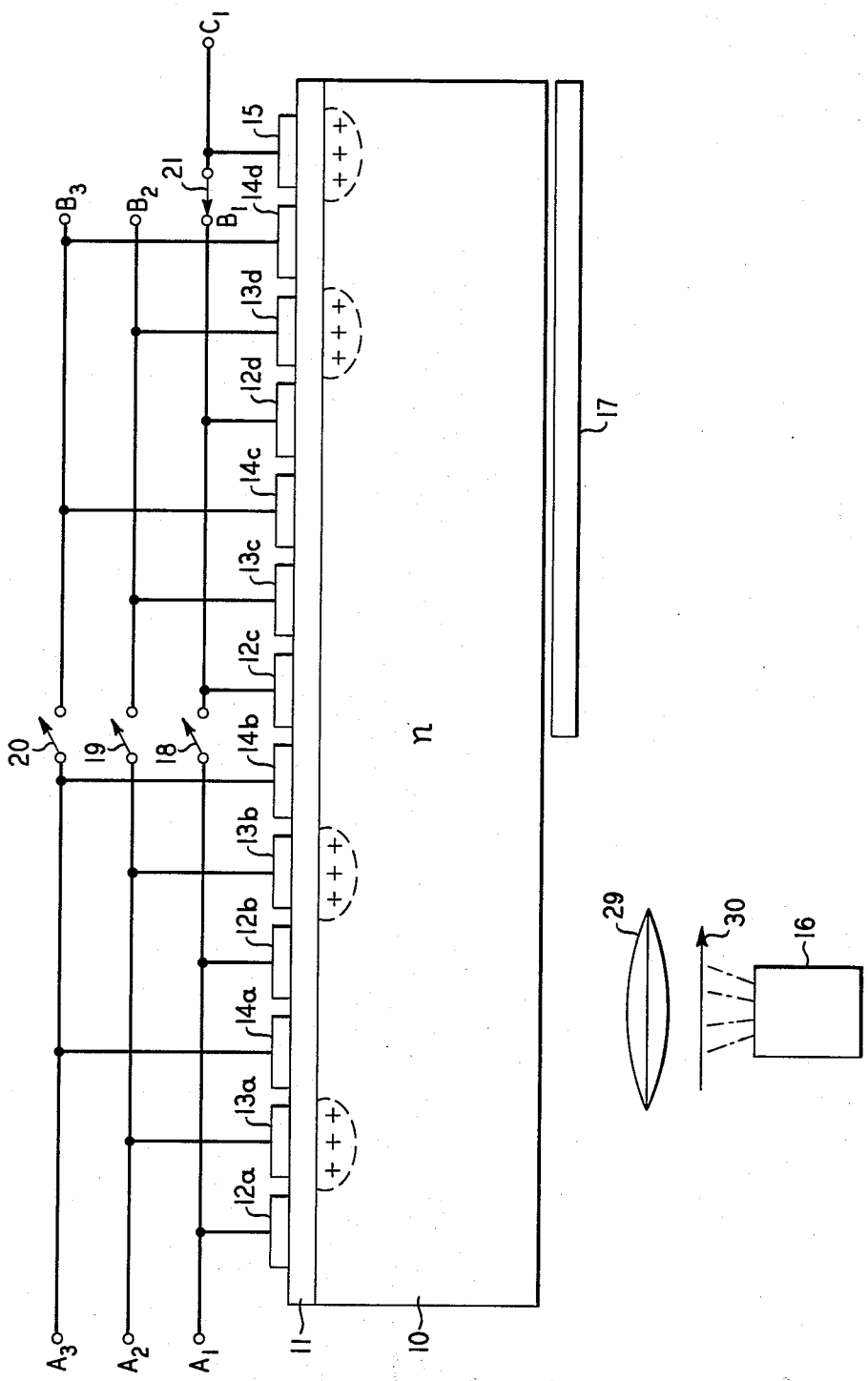

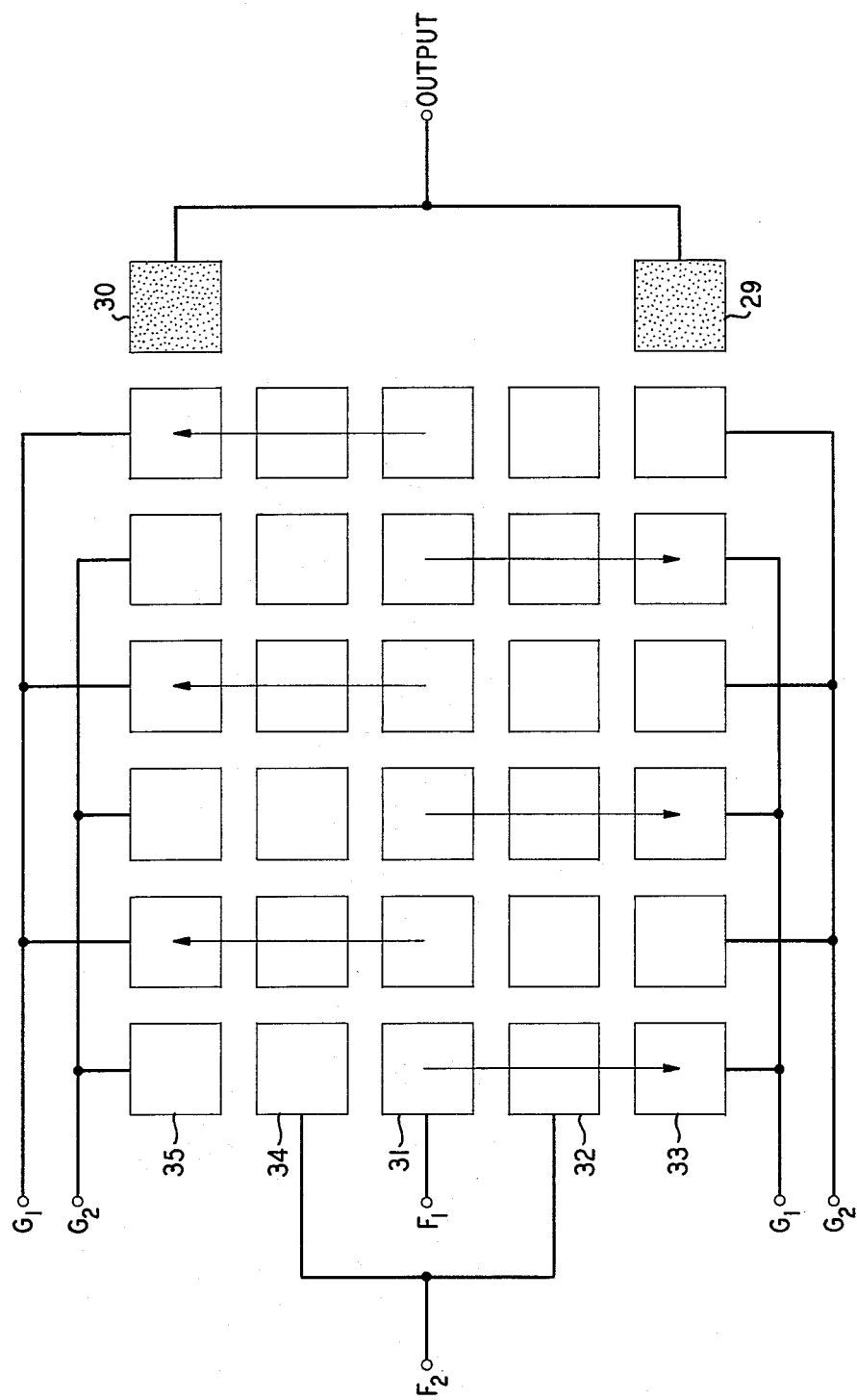

CHARGE TRANSFER IMAGING DEVICES

CROSS REFERENCE TO RELATED APPLICATIONS

This application is a continuation-in-part of applicant's copending application, Ser. No. 124,735, filed Mar. 16, 1971 now abandoned.

BACKGROUND OF THE INVENTION

This invention relates to solid state area and line imaging devices.

There is currently a widespread attempt to develop area and line imaging devices which are all solid state to replace present devices employing an electron beam as the scanning element. Recently, two new forms of semiconductor information storage devices have been proposed which would permit economical manufacture of such imaging devices.

One of these forms of information storage devices has come to be known as the Charge Coupled Device (CCD). (See, for example, Tompsett et al, "Charge Coupled 8-Bit Shift Register," *Applied Physics Letters,* Vol. 17, No. 3, pp. 111–115.) The device comprises an array of metal electrodes disposed upon an insulating layer which overlies one surface of a semiconductor medium. The device stores mobile charge carriers in the medium in potential wells created under the biased electrodes and transfers the charge by creating a succession of potential wells along the semiconductor surface when series of the electrodes are successively biased. The charge carriers may be generated in many ways. One method is to generate hole-electron pairs in the medium by photon absorption. Minority carriers will then be swept into the potential wells formed under the biased electrodes in proportion to incident light and can be read out merely by sequentially biasing the proper series of electrodes. (See U.S. patent application of W. S. Boyle and G. E. Smith, Ser. No. 11,541, filed Feb. 16, 1970 now abandoned in favor of continuation-in-part application Ser. No. 196,933 filed Nov. 9, 1971 now U.S. Pat. No. 3,858,232 and assigned to the present assignee.)

The other form of information storage device which may be used for imaging applications has come to be known as the Bucket Brigade Device (BBD). (See, for example, U.S. Pat. No. 3,660,697, filed Feb. 16, 1970, issued May 2, 1972 to C. N. Berglund and H. J. Boll.) This device also employs an array of electrodes disposed on an insulating layer overlying a semiconductor medium. Here, however, diffused regions are provided in the semiconductor beneath each electrode and extend slightly into the area below an adjacent electrode in the charge transfer path. When an electrode is pulsed, the diffusion immediately under it is reverse biased and the channel between this diffusion and its neighbor is inverted. Thus, charge is collected and stored in the diffused regions in proportion to incident light as majority carriers and transferred through the channel regions between diffusions as minority carriers when the electrodes are successively biased. It can easily be seen therefore that the reverse biased diffused regions perform in the same way as the potential wells of the CCD during charge collection.

One of the difficulties associated with these devices as proposed is a lack of sharp resolution. That is, since light is continually incident on the medium, additional carriers are collected during readout causing a smearing of the image.

Since both the CCD and BBD devices store and transfer charge carriers in a semiconductor medium by means of appropriately biased electrodes, the term "Charge Transfer Device" (CTD) has become the accepted generic description of the two types of devices. The term "localized integration site" is the generic description for the regions of charge collection, whether the potential wells of the CCD or the equivalent diffused regions of the BBD. These terms will be so used in the context of this application.

SUMMARY OF THE INVENTION

It is therefore the primary object of the present invention to provide a charge transfer imaging device which is not subject to the smearing problem usually associated with such devices.

This and other objects are achieved in accordance with the invention which comprises two arrays of electrodes, one functioning as an optical sensing array and the other as a storage and readout array. Charge carriers are formed in localized integration sites beneath the metal electrodes of the sensing array in proportion to incident light. This informtion is rapidly transferred to the area beneath the electrodes of the storage and readout array which is shielded from any light. The information may then be read out of the latter array without smearing of the optical information. Included in the device are means for preventing cross-coupling and maintaining transfer efficiency during transfer operations.

BRIEF DESCRIPTION OF THE DRAWING

These and other features of the invention are delineated in detail in the description to follow and in the drawing in which:

FIGS. 1A–1C are schematic views of one column of electrodes in an area imaging device in accordance with one embodiment of the invention demonstrating the operation of the device;

FIG. 5 is a plan schematic view of a line imaging device in accordance with a further embodiment of the invention.

DETAILED DESCRIPTION

The following description of the invention is made in terms of Charge Coupled Devices. It will be immediately apparent to those skilled in the art, however, that the same inventive concepts may be equally applied to Bucket Brigade Devices by merely providing the appropriate diffused regions in the semiconductor. Since the construction of such a Bucket Brigade Device is straightforward, in view of this disclosure, a detailed description of such a device is omitted for the sake of brevity.

Figure 1A:
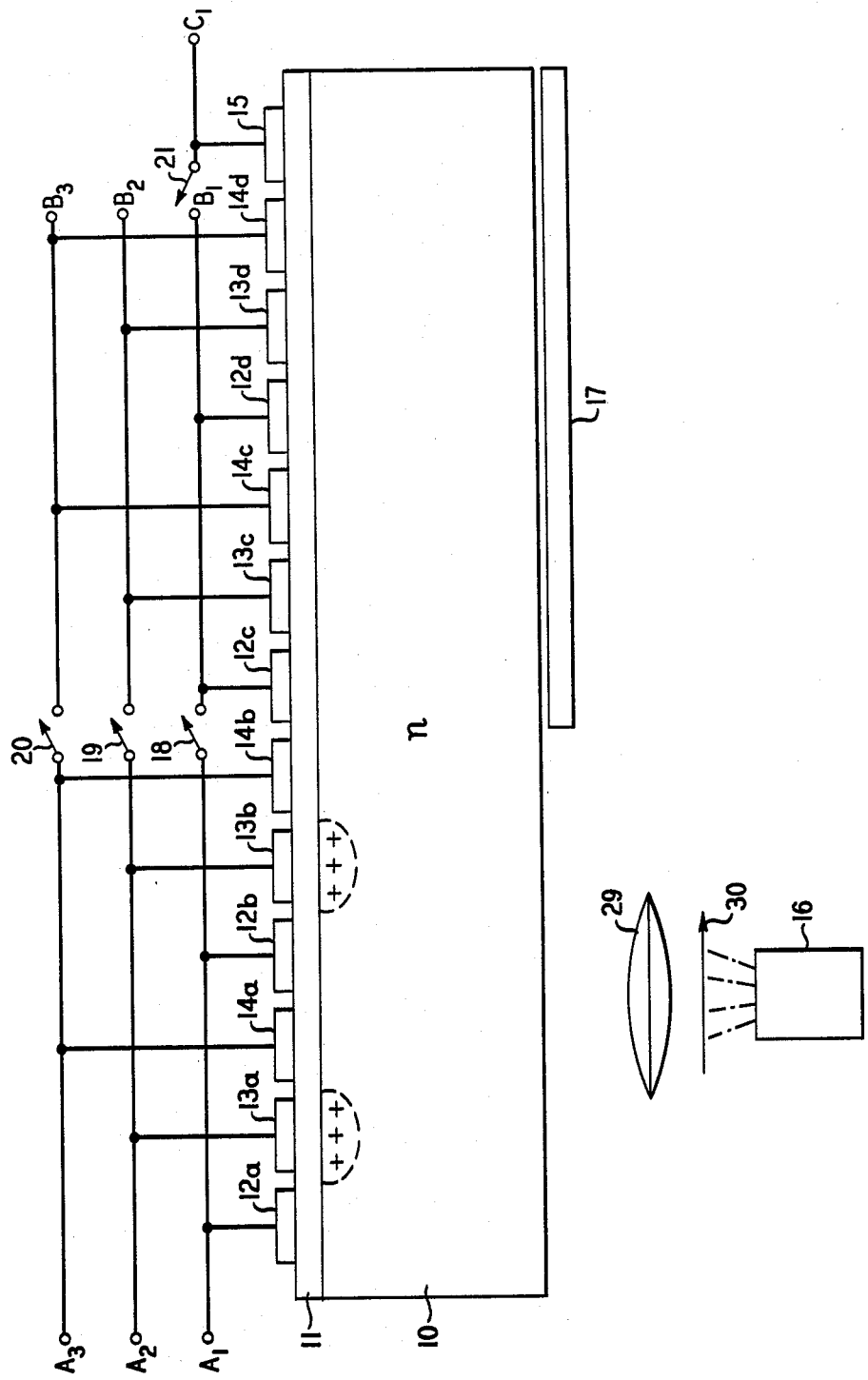
Figure 1B:
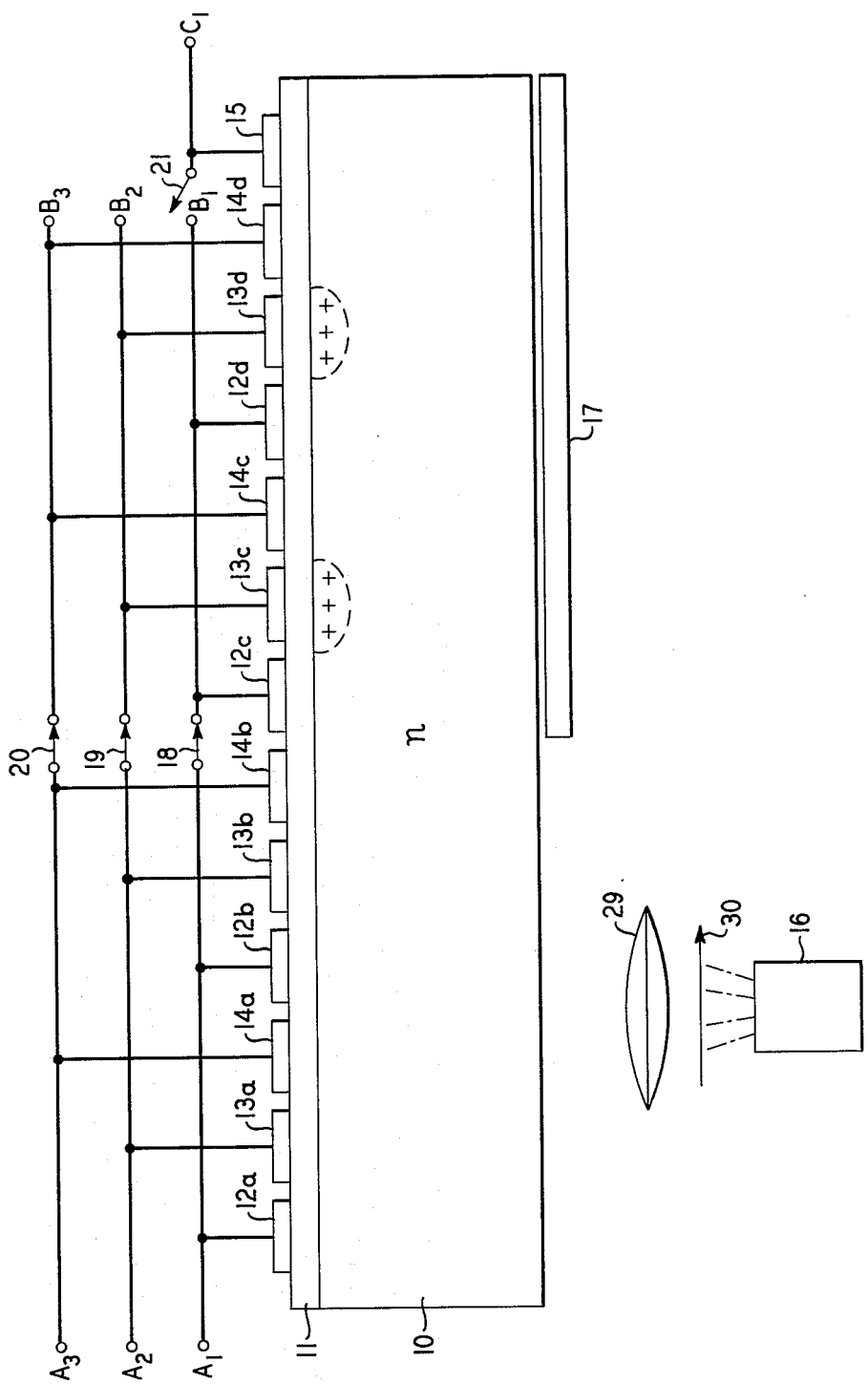
Figure 2:
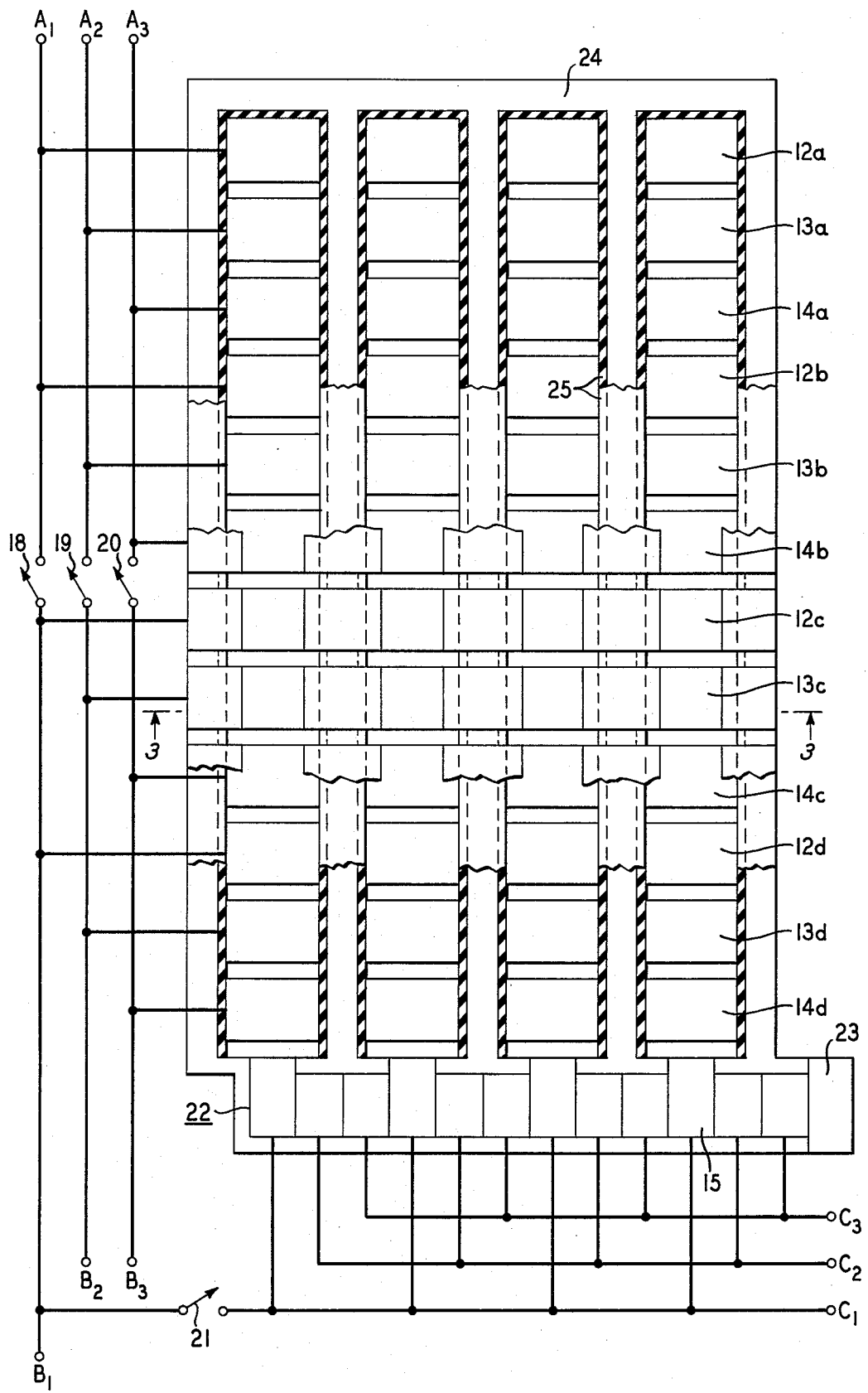
FIG. 2 is a schematic plan view of an area imaging device in accordance with one embodiment of the invention.

FIGS. 1A–1C illustrate the basic structure and operation of the area imaging device, and FIG. 2 provides a plan view of the entire array. For the purpose of simplicity, a device is shown with a sensing array of just four elements by six elements. It should be obvious that the principles of the present invention may be extended to much larger arrays.

Referring in particular to FIG. 1A, the device includes a semiconductor bulk portion 10 which, illustratively, may be n-type silicon. Overlying the surface of the bulk is a dielectric layer 11, which may be, for example, silicon dioxide. Situated on top of this dielectric layer is a series of metal electrodes 12a–d, 13a–d, 14a–d and 15. In the view shown in FIG. 1A these electrodes form one column of MIS devices in the area imaging device.

The image of an object such as 30 is projected on the surface of the semiconductor bulk opposite the electrodes by means of light source 16 and lens 29. One portion of this surface is shielded from the light by some means such as an opaque field stop 17. The actual means employed for this shielding purpose is unimportant. The device may therefore be considered divided into two portions. The first six electrodes form one column of the area sensing array, while the last seven electrodes form one column of the area storage and readout array as will be described in more detail below. It should be noted that the image may also be projected on the electrode side of the semiconductor bulk since transparent electrodes may be provided.

In the sensing portion, electrodes 12a and 12b are coupled to conduction path $A_1$, electrodes 13a and 13b are coupled to path $A_2$ and electrodes 14a and 14b are coupled to path $A_3$ to define a three-phase charge coupled system. Likewise, every third electrode of the storage and readout portion is coupled to one of the conduction paths $B_1$, $B_2$ or $B_3$ with the exception of electrode 15 which is coupled to conduction path $C_1$. Clock pulses are supplied to each of these conduction paths in order to sequentially bias the electrodes as will be explained below. Means are provided for allowing the corresponding electrodes of the two portions (e.g., 12a, 12b, 12c and 12d) to be pulsed simultaneously at certain points in time. These means are illustrated schematically in FIG. 1A as switches 18, 19 and 20. In order to read out the charge information, means are also provided for coupling conduction path $C_1$ to path $B_1$, again illustrated as a switch 21.

The operation of the device may be seen by first referring to the sequence of steps illustrated in FIGS. 1A–1C. In FIG. 1A, a pulse has been applied to electrodes 13a and 13b from conduction path $A_2$ to form potential wells in the semiconductor material 10, beneath the electrodes. The light incident on the material generates hole-electron pairs therein and minority carriers then diffuse to the nearest potential minimum as is described in the application of Boyle and Smith, supra. The minority carriers, represented by "+" in the figure, which have been swept into each potential well, therefore measure the light intensity on the semiconductor surface over the area covered by each set of three electrodes (12a, 13a, 14a and 12b, 13b, 14b, respectively).

According to the charge coupled concept, these packets of charge may be moved through the semiconductor by sequentially pulsing the electrodes and therefore forming successive potential wells into which the charge will flow. Thus, the corresponding conduction paths of the sensing portion and the storage-readout portion of the device are coupled together and a pulse sequentially applied to $A_1$, $A_2$ and $A_3$ at a rapid rate to move the charge quickly out of the sensing portion into the storage-readout portion. At the stage shown in FIG. 1B, the charge packets now reside under electrodes 13c and 13d where they are held. The rapid transfer has prevented any significant smearing effects and since the storage-readout portion is shielded from the light, the charge may now be read out at a slower rate without any additional collection of minority carriers.

In order to read out the information from the storage-readout portion, the conduction paths of the two portions are decoupled. This permits conduction paths $B_1$, $B_2$ and $B_3$ to be pulsed while conduction path $A_2$ remains pulsed such that the information in the storage-readout section is read out while the sensing section continues to integrate. In the readout operation, conduction path $C_1$ must be coupled to $B_1$ as by closing switch 21 so that charge may be transferred to the area below the last electrode. At the stage shown in FIG. 1C, the conduction paths have been pulsed in the sequence $B_3$-$B_1$-$B_2$ so that the first packet of charge has been transferred to the area below electrode 15, while the second packet is held under 13d. The first packet can now be read out in a direction out of or into the page since electrode 15 represents one electrode in a serial readout array. This is described below in reference to FIG. 2. The second packet can subsequently be transferred to electrode 15 by the same sequence of pulses and read out. In the meantime the sensing array continues to collect charge under electrodes 13a and 13b and the process of transfer and readout is repeated.

FIG. 2 illustrates the full area array formed by four columns of devices shown in FIGS. 1A–1C. That is, each electrode of FIGS. 1A–1C forms part of a row of four elements which are coupled in common to one of the conduction paths. In the view shown, the interconnections between electrodes in a row have been partially cut away to illustrate the basic structure of the device. When conduction path $A_2$ is pulsed, charge will collect beneath the electrodes in the second and fifth rows of the sensing array. Then, by pulsing the electrodes in the manner previously described, the charge is transferred to the area beneath the rows of storage electrodes coupled to path $B_2$ and subsequently read out a line at a time. The readout operation is performed by the row of electrodes 22 of which electrode 15 already mentioned is a part. A row of charge packets is transferred into the area beneath this last row by pulsing the conduction paths $B_1$, $B_2$ and $B_3$ while conduction path $C_1$ is coupled to $B_1$ through switch 21. After decoupling $C_1$, the conduction paths of the last row are pulsed in the sequence $C_2-C_3-C_1$ to move the charge laterally into some output stage such as a region of diffused p-type semiconductor material 23, where the charge can be detected by a variety of methods known in the art. The operation of the device may therefore be described in general as a parallel transfer of charge to a serial readout.

Since charge is being transferred through the semiconductor a row at a time, it is desirable to provide some means of preventing coupling of charge from one column of electrodes to the next while forming the array of electrodes as densely packed as possible. Referring to FIG. 2, this is accomplished by providing strips of metal 24 overlying the dielectric material at the edges of the device and in the area between the columns of electrodes. The function of this structure can be more easily seen with reference to FIG. 3 which is a cross-sectional view along line 3—3' of FIG. 2. The row of electrodes in FIG. 3 has been pulsed "on" and minority carriers transferred to the area of the bulk underneath.

The metal strips 24 are maintained at a constant negative bias to form depletion regions in the bulk material which are much shallower than those formed by the pulsed electrodes. This creates potential barriers between the packets of charge residing under each electrode in the row which prevent charge from moving into an adjacent column.

The biased metal strips perform a further function of maintaining transfer efficiency. In actual practice, it is desirable to apply a uniform bias to all electrodes so as to maintain shallow depletion regions in the bulk when the electrodes are not pulsed. This is done to prevent recombination of charge which has been trapped at the bulk-dielectric interface. Recombination will still occur, however, in the areas just beyond the edge of each electrode since the depletion regions formed at resting potential are essentially confined to the areas just beneath the electrodes. In the imaging device described, this would give rise to poor transfer efficiency and charge loss which would become significant for small area electrodes. The depletion regions formed in these edge areas by the metal strips, therefore, eliminate this undesired recombination.

Figure 3:
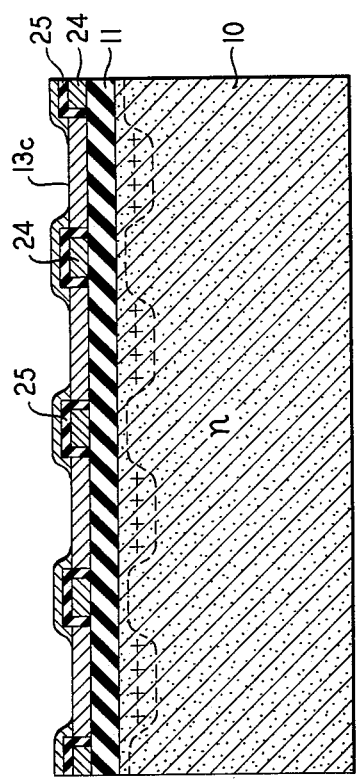
FIG. 3 is a cross-sectional view of the area imaging device along line 3—3' of FIG. 2.

FIG. 3 also illustrates one technique for forming a row of electrodes in the imaging device. After the metal strips 24 are formed on the dielectric surface, a dielectric material 25 is deposited on the strips. A metal can then be deposited over the resulting structure to form the electrodes such as 13c and the interconnections thereto so that the row of electrodes may be coupled to one of the conduction paths (in the row shown in FIG. 3, to $B_2$).

It should be clear from the description of the area imaging device above that a great many modifications are feasible. While the device has been described in terms of a three-phase charge coupled system, a four-phase or two-phase system may be employed. (For an example of the latter, see application of D. Kahng and E. H. Nicollian, Ser. No. 11,448, filed Feb. 16, 1970 and assigned to the present assignee now U.S. Pat. No. 3,651,349 issued Mar. 21, 1972.) Several other means are also available to prevent cross-coupling. For example, in the case of $n$-type silicon described, a diffusion of $n+$ conductivity-type material into the bulk between the columns should provide adequate shielding. In addition, the device may be designed so that the first row of charge packets is transferred from the sensing array directly into the last row of electrodes (22 in FIG. 2) for serial readout thereby keeping the number of rows of electrodes to a minimum.

Figure 4:
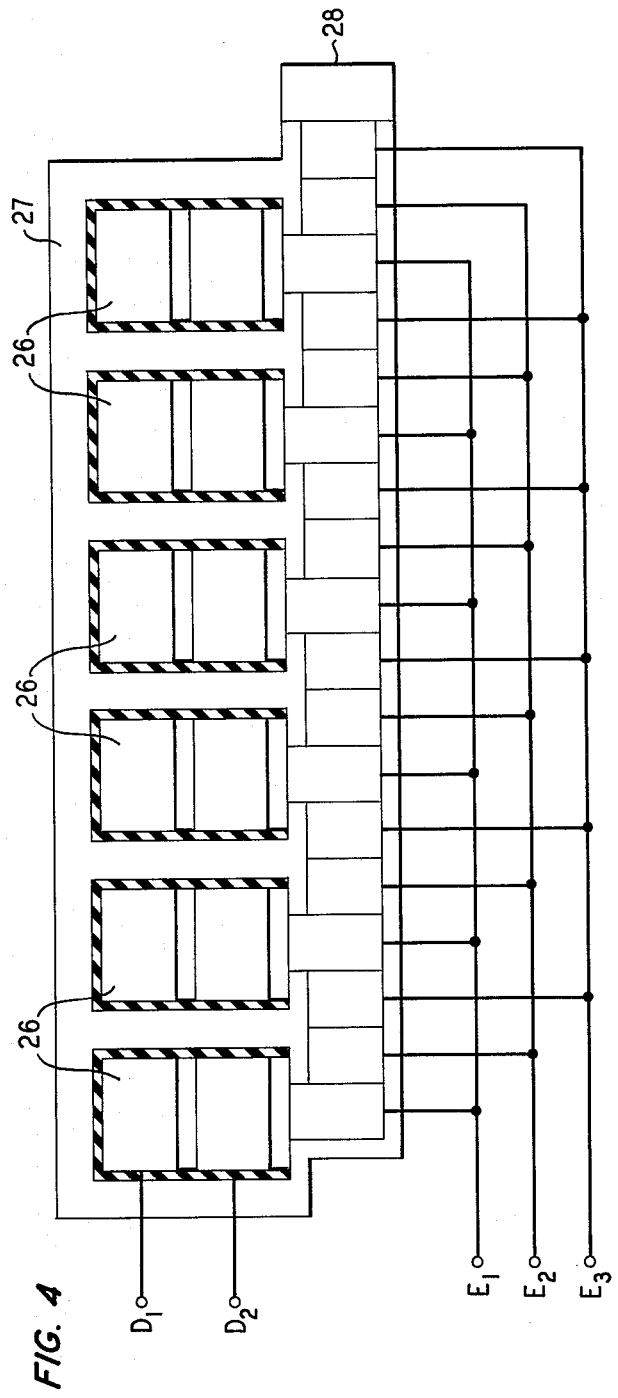
FIG. 4 is a plan schematic view of a line imaging device in accordance with another embodiment of the invention.

The same principles described in terms of the area imaging device may be utilized to construct the line imaging device shown in a plan view in FIG. 4. Here the sensing array consists of a single row of electrodes such as 26 which are coupled to conduction path $D_1$. Interconnections have been omitted in this view for the sake of clarity. As before, supplying a bias to this row of electrodes forms minority carriers in the semiconductor bulk in proportion to incident light. The second and third row of electrodes are shielded from the light and may be considered the storage and readout array. These rows are coupled to conduction paths $D_2$ and $E_1$, respectively. Once again, metal strips 27 are provided to prevent cross-coupling between adjacent columns and maintain transfer efficiency. In operation, the packets of charge are transferred out of the area under the first row of electrodes into the area beneath the third row by pulsing the conduction paths in the sequence $D_2-E_1-D_1$. $D_1$ is then held at a pulsed on condition so that the first row integrates while the packets in the third row are read out. As in the area imaging device, the row of charge packets is read out serially by sequentially pulsing conduction paths $E_1$, $E_2$ and $E_3$ until all the charge is transferred to an output stage such as diffusion 28 where the signal is detected. Once again it should be made clear that the array shown in FIG. 4 is illustrative only and, in actual practice, a row would comprise many more electrodes. In such case, signal degeneration may arise due to the large number of transfers necessary in the serial readout operation. To avoid this problem, several readout diffusions such as 28 may be interspersed in the last row and the signals subsequently combined.

Other variations of the line imaging device are possible in accordance with the invention. One such embodiment is illustrated in the plan schematic view of FIG. 5. For the sake of simplicity, only the electrode configuration and conduction paths are shown for this embodiment. The appropriately biased metal strips on the semiconductor or high concentration impurity diffusions within the semiconductor which prevent cross-coupling and help define the charge transfer path are not shown since it is believed obvious to supply the suitable geometry. The sensing array once again consists of a single row of electrodes such as 31 which are all coupled to conduction path $F_1$ (interconnections are not shown in this figure). Thus, supplying a bias to $F_1$ forms a row of localized integration sites (potential wells) in the medium for the collection of mobile charge carriers. The remaining portion of the medium is shielded from the light so that the remaining electrodes comprise the storage and read out array. It will be noted that in addition to the two rows comprising electrodes 32 and 33 which have been discussed in reference to FIG. 4, two additional rows of electrodes such as 34 and 35 are provided on the other side of the imaging row. In operation, when it is desired to read out the collected charge, the conduction paths $F_2$ and $G_1$ are pulsed in sequence. The resulting direction of charge transfer is indicated by the arrows. The packets of charge under all odd electrodes in the sensing row are transferred into the readout row comprising electrode 33 and charge under all even electrodes into the row comprising electrode 35. It will be appreciated that the direction of transfer is determined by the geometry of the biased metal strips or high concentration impurity regions (not shown). With all charge carriers now residing in one of the two readout rows, $G_1$ and $G_2$ are pulsed in sequence to transfer the charge serially to the output stage such as diffusions 29 and 30 where the signal is combined. (Although a two-phase operation is shown here, any number of phases may be used.) The main advantage of using this interdigitated approach is that the total length of the device for a given number of resolution elements and the total number of transfers for each charge packet are greatly reduced.

It will be recognized that one of the major advantages of charge transfer devices is the elimination of registration problems which were inherent in electron beam readout devices. Thus, for example, a color camera tube could be constructed using some means such as a prism for separating the light beam into red, green and blue components, each component incident upon one of three targets of the type shown in FIG. 2. The images from all three targets could then be read out simultaneously for a color display without color fringing effects due to problems of registration and lag.

It should be noted that while the invention has been described in connection with the use of a semiconductor material as the charge storage medium, it has been previously found that the charge coupled device concept is equally applicable to materials normally considered insulating or semi-insulating. The use of these materials is described fully in U.S. patent application of D. Kahng, Ser. No. 47,205, filed June 18, 1970 and assigned to the present assignee now U.S. Pat. No. 3,700,932 issued Oct. 24, 1972. Since the substitution of such insulating materials does not change the essential nature of the present proposal, their use should be considered within the scope of the invention.

The logic circuits which may be employed to pulse the electrodes of the area and line imaging devices in the manner described are varied and can easily be supplied by those skilled in the art. Consequently, a description of these circuits has been omitted. In this regard it will be understood that the use of the term "circuit means" in the following claims includes the appropriate logic circuitry and conduction paths of the device but is exclusive of the bias supply.

Various additional modifications and extensions of this invention will become apparent to those skilled in the art. All such variations and deviations which basically rely on the teachings through which this invention has advanced the art are properly considered within the spirit and scope of this invention.

What is claimed is:

1. A charge transfer area imaging device comprising a charge storage medium, an insulating layer covering at least a portion of one surface of said medium, a first array of metal electrodes comprising a plurality of rows and columns of electrodes, conduction paths for simultaneously biasing certain rows of electrodes of said first array to form a plurality of columns of localized integration sites in said medium for the collection of mobile charge carriers generated in said medium in response to light incident on said medium, and means for projecting an image onto one surface of said medium to form charge carriers therein, characterized in that said device further comprises a second array of metal electrodes comprising a plurality of columns of electrodes formed on said insulating layer over an area of the storage medium contiguous to the area under said first array, said columns of said second array being aligned with the columns of said first array so as to receive in the medium thereunder said charge carriers from beneath corresponding columns of said first array, conduction paths for sequentially biasing the electrodes of said first and second arrays so as to transfer said columns of charge carriers out of the area under said first array to beneath corresponding columns of said second array, and means for shielding the surface of the storage medium under said second array from incident light.

2. The device according to claim 1 wherein the charge storage medium comprises a body of semiconductor material.

3. The device according to claim 2 further comprising strips of metal overlying said insulating layer in the area between adjacent columns of electrodes and means for applying a constant potential to said strips so as to form depletion regions in said semiconductor material beneath said strips to isolate charge carriers beneath one column of electrodes from charge carriers beneath adjacent columns and to prevent recombination of charge at the semiconductor-insulator interface in said area.

4. The device according to claim 3 further comprising strips of metal overlying said insulating layer in the area around the edges of said arrays and means for applying a constant potential to said strips so as to form depletion regions in the semiconductor body beneath said strips to prevent recombination of charge at the semiconductor-insulator interface in said area.

5. The device according to claim 1 wherein the second array of electrodes includes a row of electrodes positioned to receive in the medium thereunder charge carriers from beneath the columns of said second array and conduction paths for sequentially biasing the electrodes of said row to transfer said charge carriers serially for detection.

6. The device according to claim 5 further comprising circuit means for biasing the electrodes of said first array so as to form a plurality of columns of localized integration sites in the storage medium for collecting a plurality of columns of mobile charge carriers, circuit means for sequentially biasing the electrodes of said first and second arrays so as to transfer all of said columns of charge carriers from beneath said first array to beneath corresponding columns of said second array, circuit means for biasing the electrodes of said second array so as to store said columns of charge carriers in the medium under certain electrodes of the columns of the second array, circuit means for sequentially biasing the electrodes of said second array so as to sequentially transfer said charge carriers beneath said columns to beneath said row of electrodes adapted for serial readout and circuit means for sequentially biasing said row of electrodes so as to serially transfer said charge carriers thereunder for detection.

7. A charge transfer line imaging device comprising a charge storage medium, an insulating layer covering at least a portion of one surface of said medium, a first row of metal electrodes formed on said insulating layer, and means for projecting an image onto one surface of said medium to form charge carriers therein, characterized in that said device further comprises a conduction path electrically coupling together all electrodes of said first row to form a row of localized integration sites in said medium thereunder for the collection of mobile charge carriers generated in said medium in response to said incident light, a second array of metal electrodes, comprising a second row of electrodes, formed on said insulating layer over an area of the storage medium contiguous to the area under said first row, certain electrodes of said second array aligned in columns with said first row so as to receive in the medium thereunder charge carriers from a corresponding integration site, conduction paths for sequentially biasing the electrodes of said second row to transfer said charge carriers thereunder serially for detection, and means for shielding the surface of the storage medium under said second array from incident light.

8. The device according to claim 7 further comprising circuit means for sequentially biasing the electrodes of said first and second arrays so as to transfer the charge carriers from beneath said first array to beneath the corresponding electrode of said second array and circuit means for sequentially biasing the electrodes of said second array so as to transfer said row of charge carriers serially for detection.

9. The device according to claim 7 wherein said second array comprises two rows of metal electrodes disposed on said insulating layer, one row over the area of the storage medium on each side of said first row, each of said rows aligned in columns with said first row to receive in the storage medium thereunder charge carriers from a different set of every other integration sites.

10. The device according to claim 7 wherein the charge storage medium comprises a body of semiconductor material.

11. The device according to claim 10 further comprising strips of metal overlying said insulating layer in the area between adjacent columns of electrodes formed by the two arrays and means for applying a constant potential to said strips so as to form depletion regions in said semiconductor body beneath said strips to isolate charge carriers beneath one column of electrodes from charge carriers beneath adjacent columns, and to prevent recombination of charge at the semiconductor-insulator interface in said area.

12. The device according to claim 11 further comprising strips of metal overlying said insulating layer in the area around the edges of said arrays and means for applying a constant potential to said strips so as to form depletion regions in said semiconductor body beneath said strips to prevent recombination of charge at the semiconductor-insulator interface in said area.

13. An optical scanning system comprising:
    (a) a charge coupled shift register defined over a first region of a semiconductor substrate of one conductivity type;
    (b) an optically opaque layer covering said shift register;
    (c) a plurality of optically active regions adjacent respective bits of said shift register, said plurality of regions respectively effective to generate electrical charge in said substrate surface responsive to impinging light; said optically active regions defined by parallel electrodes overlying said substrate and separated therefrom by a thin insulating layer, the electrodes of said optically active regions electrically connected in common; and
    (d) means for simultaneously transferring said electrical charge to corresponding bits of said shift register.

14. An optical scanning system as set forth in claim 13 including means for preventing lateral spread of electrical charge between adjacent optically active regions.

15. An optical scanning system as set forth in claim 14 wherein said means for preventing lateral spread of electrical charge comprises a region of high conductivity material of said one conductivity type in said semiconductor substrate between adjacent optically active regions.

16. An optical scanning system, the combination comprising:
    (a) a first charge coupled shift register defined over one surface of a semiconductor substrate of one conductivity type, each bit of said first charge coupled shift register defined by at least three spaced apart, substantially parallel first conductive electrodes separated from said substrate by a thin insulating layer, each bit defining an optical resolution unit of said scanner;
    (b) an optically opaque coating formed over said first shift register;
    (c) a second plurality of substantially parallel conductive electrodes defined on said one surface and separated therefrom by a relatively thin insulating layer, said second plurality of conductive electrodes laterally spaced from said first charge coupled shift register;
    (d) bias means for applying a predetermined voltage to said second conductive electrodes said bias means electrically connecting said second conductive electrodes in common; and
    (e) transfer means for selectively transferring electrical charge from under said second conductive electrodes to respective bits of said first charge coupled shift register.

17. An optical scanning system as set forth in claim 16 wherein said transfer means comprises a third conductive electrode over an insulating layer intermediate said first shift register and said second plurality of conductive electrodes.

18. An optical scanning system as set forth in claim 16 wherein means are included for preventing lateral spread of electrical charge between adjacent electrodes of said second conductive electrodes.

19. An optical scanning system as set forth in claim 18 wherein said means for preventing lateral spread of charge comprises a region of high conductivity type material in said substrate between adjacent electrodes.

* * * * *

UNITED STATES PATENT AND TRADEMARK OFFICE
CERTIFICATE OF CORRECTION

PATENT NO. : 4,085,456
DATED : April 18, 1978
INVENTOR(S) : Michael F. Tompsett

It is certified that error appears in the above-identified patent and that said Letters Patent are hereby corrected as shown below:

Column 9, line 36, after "regions" insert --respectively--.

Signed and Sealed this

Seventeenth Day of October 1978

[SEAL]

Attest:

RUTH C. MASON
*Attesting Officer*

DONALD W. BANNER
*Commissioner of Patents and Trademarks*